(12) United States Patent
Kondo et al.

(10) Patent No.: US 6,303,878 B1
(45) Date of Patent: Oct. 16, 2001

(54) MOUNTING STRUCTURE OF ELECTRONIC COMPONENT ON SUBSTRATE BOARD

(75) Inventors: Kenji Kondo; Masayuki Aoyama, both of Kariya; Koji Kondo, Toyohashi; Masanori Takemoto, Anjo; Hidehiro Mikura, Kariya; Tetuhiro Nakano, Nagoya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/121,303

(22) Filed: Jul. 23, 1998

(30) Foreign Application Priority Data

| Jul. 24, 1997 | (JP) | 9-198829 |
| Jul. 28, 1997 | (JP) | 9-201751 |
| Jul. 30, 1997 | (JP) | 9-204729 |
| Sep. 19, 1997 | (JP) | 9-255568 |
| Sep. 19, 1997 | (JP) | 9-255569 |

(51) Int. Cl.⁷ .................................................. H05K 1/09
(52) U.S. Cl. .................... 174/261; 174/260; 257/786; 361/777
(58) Field of Search .................................. 174/260, 261; 361/777; 257/786; 438/108

(56) References Cited

U.S. PATENT DOCUMENTS 5,742,009 * 4/1998 Hamzehdoost et al. .............. 174/260

FOREIGN PATENT DOCUMENTS

| 654 818 | 5/1995 | (EP) . |
| 63-136697 | 6/1988 | (JP) . |
| 6-177136 | 6/1994 | (JP) . |
| 7-93306 | 10/1995 | (JP) . |
| 8-83865 | 3/1996 | (JP) . |
| 8-172143 | 7/1996 | (JP) . |

OTHER PUBLICATIONS

Philips Technical Review, vol.34, 1974, No. 4, A.van der Drift et al, pp 85–95.
Solid State Technology, Jul. 1970,vol.,13/No. 7. pp. 48–54.
29th symposium article collection, p. 45 no dates.
Electronics mounting technique handbook, pp. 308–309 no dates.
Semiconductor high density mounting material pp. 31–32 no dates.

* cited by examiner

Primary Examiner—Albert W. Paladini
(74) Attorney, Agent, or Firm—Pillsbury Winthrop LLP

(57) ABSTRACT

A BGA package is mounted on a multi-layer printed wiring board having a plurality of electrodes arranged in a matrix form through a plurality of solder bumps. In the most externally-located electrodes, a lead wire is formed to extend from a portion of the most-externally-located electrode located inside of a polygon formed by connecting each of the centers of adjacent most-externally-located electrodes. Therefore, the solder bumps are prevented from coming off the most-externally-located electrodes because a portion of the most-externally-located electrode to which stress caused by an external shock is intensively applied is located in an outside of the polygon. Thus, a contact failure between the BGA package and the multi-layer printed wiring board is prevented.

9 Claims, 9 Drawing Sheets

MOUNTING STRUCTURE OF ELECTRONIC COMPONENT ON SUBSTRATE BOARD

CROSS-REFERENCE TO RELATED APPLICATION

This application relates to and claims priority from Japanese Patent Application Nos. Hei. 9-198829 filed on Jul. 24, 1997, 9-201751 filed on Jul. 28, 1997, 9-204729 filed on Jul. 30, 1997, 9-255568 filed on Sept. 19, 1997 and 9-255569 filed on Sep. 19, 1997, the contents of which are hereby incorporated by reference.

BACKGROUND OF THE INVENTION

1. Field of the Invention

The present invention relates to an electronic component mounted on a substrate board through an array of solder bumps attached to the back of the electronic component so that the electronic component is electrically connected to the substrate board, especially a mounting structure of the electronic component on the substrate board. The present invention is suitably applied to a mounting structure of an electronic component used in portable electronic equipments.

2. Related Art

As shown in FIG. 16, a conventional ball-grid array (hereinafter referred to as BGA) package 101 has an array of solder bumps 102 on its back surface, and a multi-layer printed wiring board 103 has a plurality of substantially circular electrodes 104. Each of the solder bumps 102 is melted and connected to each of the electrodes 104 so that the BGA package 101 is mounted on the multi-layer printed wiring board 103.

As shown in FIG. 17, the multi-layer printed wiring board 103 has a lead wire 105 extending from each of the electrodes 104. The lead wires 105 which extend from most externally-located electrodes 104a (hereinafter referred to as external electrodes 104a) are generally formed on the surface layer of the multi-layer printed wiring board 103; thereby facilitating external electrical connection of the extending wires 105. The external electrodes 104a are to be connected to the most externally-located solder bumps 102.

The lead wire 105 is covered with solder resist 106 for the purpose of protection. In FIG. 17, a slant line portion indicates an area covered by the solder resist 106. The entire surface of the electrode 104 (104a) is exposed so that a contact area between the solder bump 102 and the electrode 104 is increased. Therefore, in the external electrode 104a, the lead wire 105 is partially exposed because the lead wire 105 is formed on the surface layer of the multi-layer printed wiring board 103, and the solder bump 102 is thereby connected to both the external electrode 104a and a part of the lead wire 105.

When an external shock is applied to the BGA package 101 or the multi-layer printed wiring board 103, stress is applied to the external electrodes 104a intensively, especially when the multi-layer printed wiring board 103 is made of flexible resin or the like. Therefore, bonding portion between the external electrode 104a and the solder bump 102 is required to have sufficient bonding strength to withstand this intensive stress.

As shown in FIG. 17, the lead wire 105 from the external electrode 104a generally extends toward outside by the shortest route. That is, when a polygon is formed by connecting each of the centers of the adjacent external electrodes 104a, the lead wire 105 extends from a portion of the external electrode 104a located outside the polygon, in a direction in which the lead wire 105 becomes away from a portion of the solder bump 102 located inside the polygon.

However, as shown in FIG. 16, the lead wire 105 extends from a portion A of the external electrodes 104a, which is located outside the polygon, and is mostly applied with the intensive stress when the external shock is applied to the BGA package 101 or the multi-layer printed wiring board 103. Therefore, when the external shock is applied, the solder bump 102 may be detached from the portion A, resulting in a contact failure between the BGA package 101 and the multi-layer printed wiring board 103.

SUMMARY OF THE INVENTION

In view of the foregoing problems, it is an object of the present invention to provide a mounting structure of an electronic component which is mounted on a substrate board in such a manner that a contact failure therebetween is prevented from occurring even when an external shock is applied thereto.

According to the present invention, an electronic component is mounted on a substrate board having a plurality of electrodes through a plurality of solder bumps. Most-externally-located electrode are provided with lead wires formed on a surface layer of the substrate board, extending from a portion of the corresponding electrode located inside of a polygon formed by connecting each of the centers of adjacent most-externally-located electrodes with respect to a plurality of the most-externally-located electrodes. As a result, the lead wire does not extend from an outside area of the polygon, to which stress is intensively applied due to an external shock. Thus, even when the external shock is applied to the electronic component or the substrate board, the solder bump is prevented from being detached from the most-externally-located electrode, thereby reducing contact failure between the electronic component and the substrate board.

Preferably, some of the most-externally-located electrodes are provided with lead wires embedded in the substrate board so that the solder bumps are bonded only to the most-externally-located electrodes, not to the lead wires. That is, the solder bump and the most-externally-located electrode are bonded to each other so that the solder bump to be bonded terminates at the outer peripheral portion of the electrode, i.e., at the side of the electrode. This increases bonding strength between the solder bumps and the most-externally-located electrodes, preventing the solder bumps from coming off the most-externally-located electrodes.

When the electronic component is provided with an interposer on which an array of plural electrodes is formed, the solder bumps are preferably bonded to most-externally-located electrodes disposed on the interposer of the electronic component so that the solder bumps are bonded to not only the surfaces but also the sides of the electrodes. This increases bonding strength between the solder bumps and the electrodes of the interposer, preventing contact failure between the solder bumps and the interposer.

BRIEF DESCRIPTION OF THE DRAWINGS

Additional objects and advantages of the present invention will be more readily apparent from the following detailed description of preferred embodiments when taken together with the accompanying drawings, in which.

DETAILED DESCRIPTION OF THE PRESENTLY PREFERRED EMBODIMENTS

Preferred embodiments of the present invention are described hereinafter with reference to the accompanying drawings.

(First Embodiment)

Figure 1:
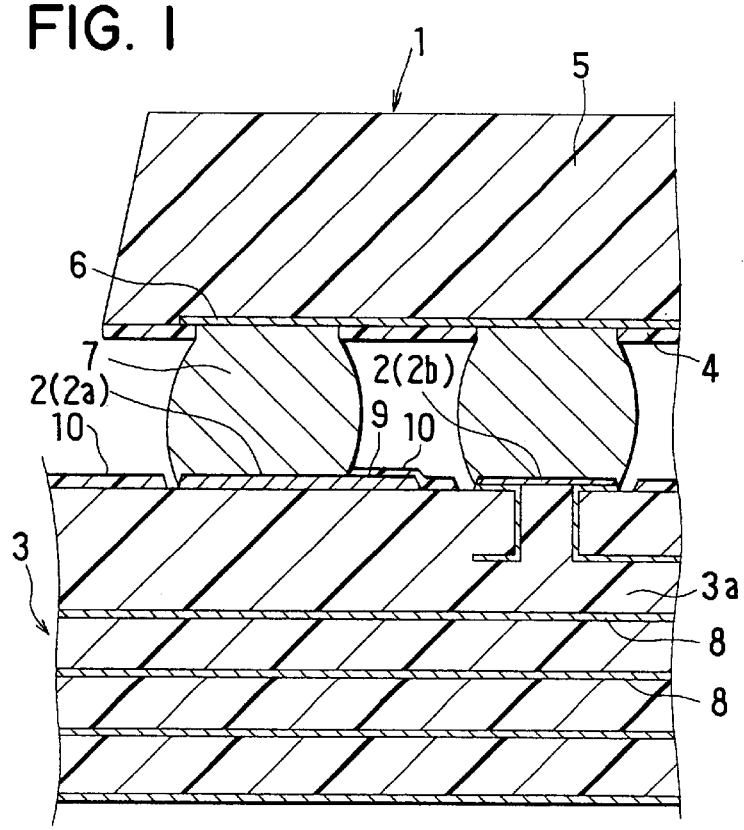
FIG. 1 is a schematic cross-sectional view showing a BGA package mounted on a multi-layer printed wiring board according to a first embodiment of the present invention.
Figure 2:
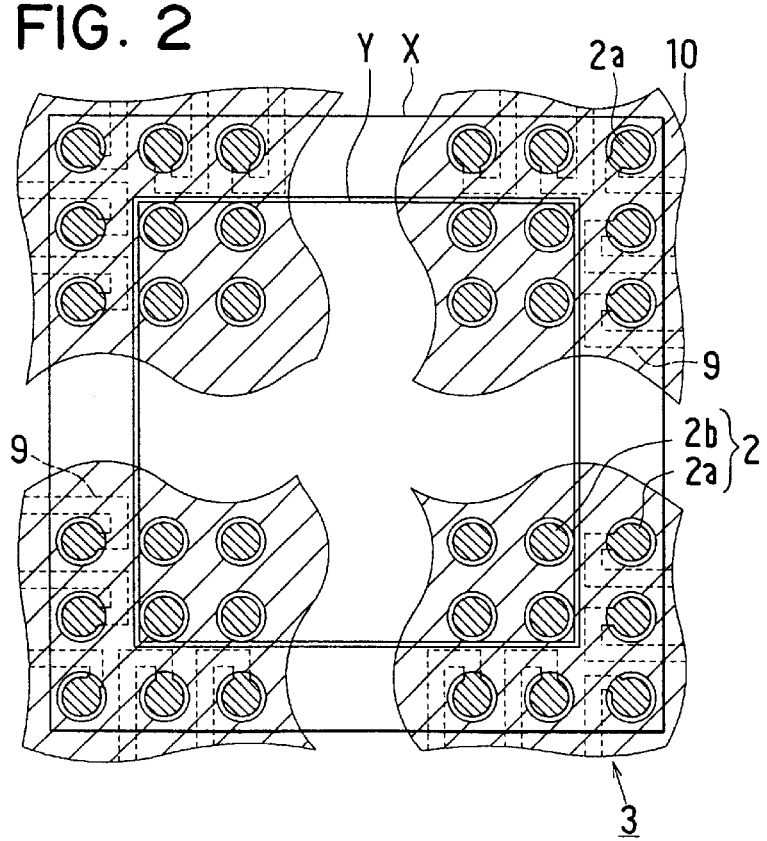
FIG. 2 is a schematic diagram showing a configuration pattern of electrodes of the multi-layer printed wiring board according to the first embodiment.

Referring to FIG. 1, a BGA package 1 is mounted on a multi-layer printed wiring board 3. The multi-layer printed wiring board 3 has a plurality of circular pad electrodes 2 arranged in a matrix form, as shown in FIG. 2. The multi-layer printed wiring board 3 can have any desired number of the electrodes 2 arranged in any desired pattern at any desired interval.

The method of forming the BGA package 1 will be described. A semiconductor chip (not shown) is attached to an interposer 4 having a circuit wiring layer 6 by adhesive, and is electrically connected to the circuit wiring layer 6 via gold (Au) wires or the like. Then, the semiconductor chip and the Au wires are integrally sealed by sealing resin 5. In the first embodiment, the interposer 4 is made of polyimide tape because polyimide tape can be readily thinned and produced at low cost, and the sealing resin 5 is made of epoxy resin, for example.

The interposer 4 constituting the back of the BGA package 1 has a plurality of holes arranged in a matrix form. A plurality of solder balls are melted and connected to the circuit wiring layer 6 of the interposer 4 through the holes formed in the interposer 4. Thus, solder bumps 7 arranged in the matrix form are formed on the back of the BGA package 1.

Some of the electrodes 2 formed on the multi-layer printed wiring board 3 are dummy electrodes which do not perform signal transmission. The dummy electrodes keep the solder bumps 7 having the same height, and ensure firm contact between the BGA package 1 and the multi-layer printed wiring board 3.

The multi-layer printed wiring board 3 is formed by laminating a plurality of wiring layers 8. The configuration of the electrodes 2 formed on the multi-layer printed wiring board 3 corresponds to the configuration of the solder bumps 7, and each of the electrodes 2 is connected to the corresponding solder bump 7 when the BGA package 1 is mounted on the multi-layer printed wiring board 3.

Figure 3:
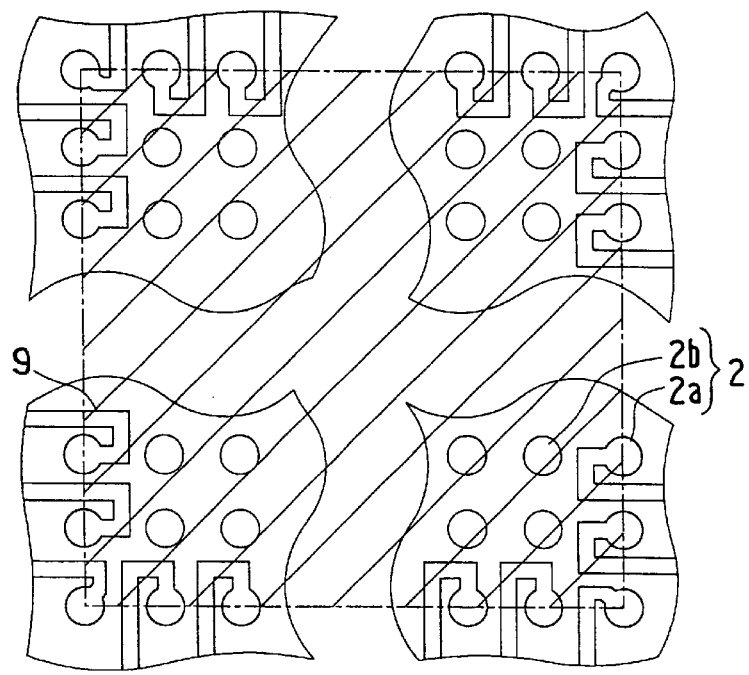
FIG. 3 is a schematic diagram showing lead wires according to the first embodiment.

Referring to FIG. 2, each of most externally-located electrodes 2a (hereinafter referred to as external electrodes 2a) in an area X is provided with a lead wire 9 for external connection of the electrodes 2a. The lead wires 9 are formed on the surface layer of the wiring layers 8. Further, as shown in FIG. 3, each of the lead wires 9 extends from the inside of a polygon (indicated by an alternate long and short dash line) formed by connecting each of the centers of the adjacent external electrodes 2a toward the outside of the polygon for external connection, while bending two times. The lead wire 9 extending from each of the external electrodes 2a bends in the same direction relative to the corresponding external electrode 2a. Internal electrodes 2b located in an area Y in FIG. 2 are also provided with lead wires connected thereto (not shown). The lead wires from the internal electrodes 2b are formed in the surface layer or the inner layers of the wiring layers 8 of the multi-layer printed wiring board 3.

Next, a manufacturing method of the multi-layer printed wiring board 3 will be described. For brevity, it will be described on the multi-layer printed wiring board 3 made of four copper foil layers serving as the wiring layer 8. In FIG. 1, the multi-layer printed wiring board 3 has six copper foil layers.

First, a core material 3a having two copper foils applied on both the upper and lower sides is prepared. A plurality of through-holes (i.e., blind via-holes) are formed at predetermined locations in the core material 3a by a cutting drill. The through-holes are copper-plated so that the copper foils on the upper and lower sides of the core material 3a are electrically connected with each other through the trough-holes. Thus, the board having the copper-plated through holes is completed.

Next, two boards having the copper-plated through-holes are prepared and pattern etching is performed on the copper foils on the sides of the boards to be connected with each other later. Then, with a prepreg made of glass fabric containing epoxy resin being inserted between the two boards, the two boards are laminated with each other by hot-pressing. Thus, a board having four copper foil layers is formed.

Next, a plurality of though-holes penetrating the whole four layers are formed by a cutting drill and are copper-plated so that the four copper foils are electrically connected to one another. The through-holes formed in the board are filled with, for example, resin. Further, pattern etching is performed on the upper side of the board on which the BGA package 1 is mounted, so that lead wires 9 and electrodes 2a, 2b are formed by the remaining parts of the copper foil. Signals can be exchanged between the semiconductor chip and an outside circuit through separated routes formed in the wiring layers 8 of the multi-layer printed wiring board 3 and the solder bumps 7. The separated routes end at the sides or the back surface of the board 3. At this time, the lead wire 9 from each of the external electrodes 2a is formed to extend from the inside of a polygon formed by connecting each of the centers of the adjacent external electrodes 2a.

Next, the lead wires 9 are covered by printed solder resist 10, for the purpose of protection. The solder resist 10 has a plurality of holes through which the electrodes 2 are exposed. The size of each hole is determined so that the electrodes 2 are not covered by the solder resist 10 even when the solder resist 10 is printed at a position slightly deviating from the correct position. Further, the electrodes 2 are plated with nickel-gold (Ni—Au), tin (Sn) or palladium (Pd) in a non-electrolytic plating step. Thus, the multi-layer printed wiring board 3 having a plurality of wiring layers 8 is completed.

The BGA package 1 is positioned and mounted on the multi-layer printed wiring board 3 by the solder bumps 7. In the external electrodes 2a of this structure, stress caused by an external shock or the like is intensively applied to a portion outside the polygon formed by connecting each of the centers of the adjacent external electrodes 2a. Therefore, when the lead wire 9 is formed to extend from the outside of the polygon, the solder bumps 7 may readily crack and/or come off the external electrodes 2a due to the intensive stress.

According to the first embodiment, in the external electrodes 2a, each of the lead wires 9 is formed to extend from the inside of the polygon. Therefore, each of the lead wires 9 does not extend from the portion where intensive stress is applied. In other words, the portion in which the solder bumps 7 tend to crack and/or to be detached from the external electrodes 2a due to weak bonding strength does not conform to the portion in which intensive stress is applied. This prevents the solder bumps 7 from cracking and/or being detached from the external electrodes 2a. Further, as shown in FIG. 1, in the portion where intensive stress is applied, each of the solder bumps 7 is connected to not only the surface but also the side of the external electrode 2a; thereby increasing bonding strength between the solder bumps 7 and the external electrodes 2a. Therefore, when stress is intensively applied to the external electrodes 2a due to the external shock or the like, the solder bumps 7 can be prevented from cracking and/or coming off the external electrodes 2a.

Thus, in the first embodiment, even when the external shock is applied to the BGA package 1 or the multi-layer printed wiring board 3, contact failure between the BGA package 1 and the multi-layer printed wiring board 3 can be prevented from occurring even if the multi-layer printed wiring board 3 is made of flexible resin.

(Second Embodiment)

A second embodiment of the present invention will be described with reference to FIGS. 4, 5, 6A and 6B. In this and the following embodiments, description of components which are substantially the same to those in the previous embodiment is omitted.

Figure 4:
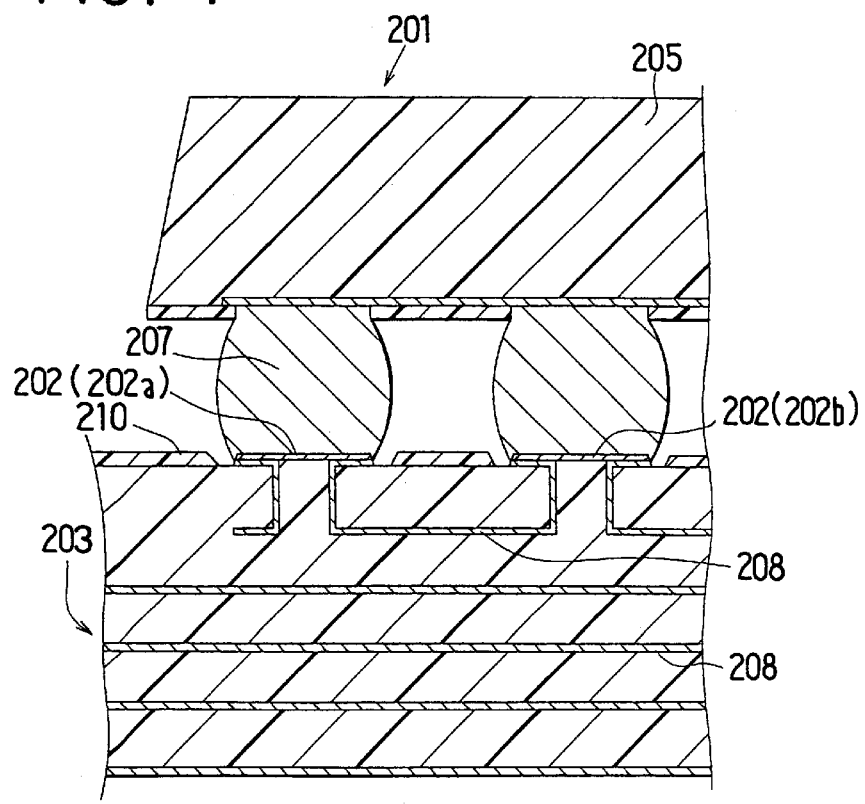
FIG. 4 is a schematic cross-sectional view showing a BGA package mounted on a multi-layer printed wiring board according to a second embodiment of the present invention.
Figure 5:
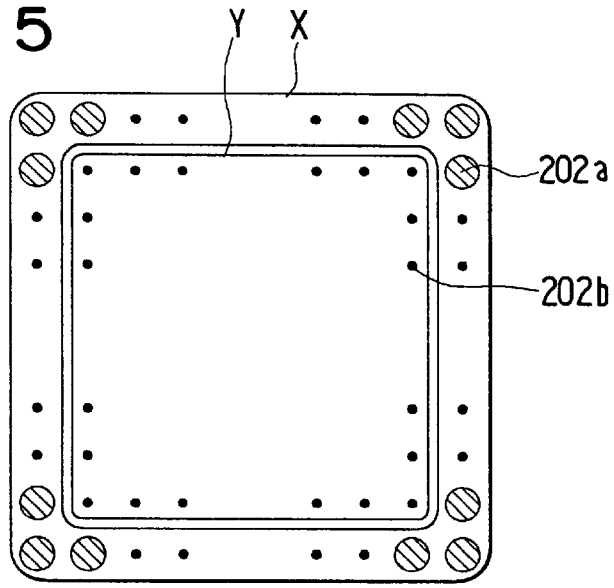
FIG. 5 is a schematic diagram showing a configuration pattern of electrodes of the multi-layer printed wiring board according to the second invention.

Referring to FIGS. 4, 5, in the second embodiment, lead wires from at least most-externally-located electrodes 202a (hereinafter referred to as external electrodes 202a), within an area X in FIG. 5, are not exposed on a multi-layer printed wiring board 203. On the other hand, some of inner electrodes 202b surrounded by the external electrodes 202a, within an area Y in FIG. 5, are provided with lead wires (not shown) exposed on the board 203.

In the second embodiment, in the same manner as in the first embodiment, pattern etching is performed on the surface of the multi-layer printed wiring board 203 so that lead wires are formed by the remaining copper foil, while parts of the copper foil to become electrodes 202 are left. However, the lead wires for the external electrodes 202a are not formed from the surface copper foil of the multi-layer printed wiring board 203 by pattern etching.

Figure 6A:
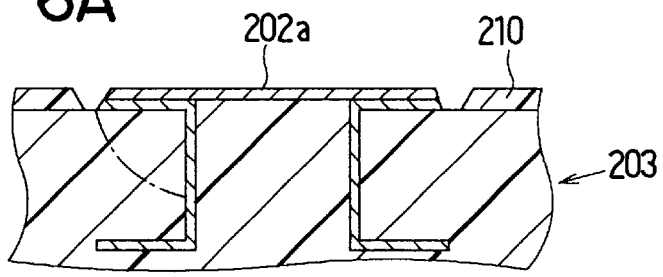
FIG. 6A is a schematic cross-sectional view showing a part of the multi-layer printed wiring board according to the second invention.
Figure 6B:
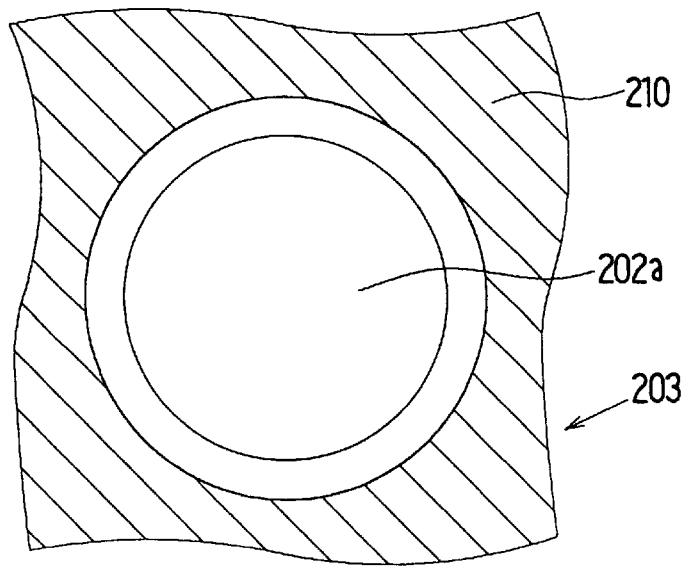
FIG. 6B is a schematic top view showing an electrode of the multi-layer printed wiring board according to the second embodiment.

As shown in FIGS. 6A, 6B, the external electrodes 202a are not covered by solder resist 210, indicated by a slant line portion in FIG. 6B, and are entirely exposed. The lead wires from the external electrodes 202a are made of the copper foil or plated copper inside the printed board 203. Thus, the external electrodes 202a are independent pads having no lead wire which is exposed on the printed board 203. Therefore, solder bump 207 to be bonded to each of the external electrodes 202a terminates at the peripheral portion thereof, and not connected to the lead wire. That is, as shown in FIG. 4, the solder bump 207 is bonded onto not only the surface but also the side of the external electrode 202a, increasing bonding strength between the solder bump 207 and the external electrode 202a. This prevents the solder bump 207 from cracking and/or coming off the external electrode 202a due to intensive stress caused by an external shock, reducing contact failure between a BGA package 201 and the multi-layer printed wiring board 203, even when the board 203 is made of flexible resin.

In the second embodiment, the external electrodes 202a are independent pads having the lead wiring formed inside the multi-layer printed wiring board 203; however, the external electrodes 202a may be dummy electrodes which are not electrically connected with semiconductor chips disposed in the BGA package 201. Therefore, the contact failure between the BGA package 201 and the multi-layer printed wiring board 203 can also be reduced because stress caused by an external shock is intensively applied to the dummy electrodes. However, in this case, note that the BGA package 201 and the multi-layer printed wiring board 203 need to be enlarged for the extra space used for the dummy electrodes.

Further, a core material of the multi-layer printed wiring board 203 may have a crack as indicated by a two-dot chain line in FIG. 6A, due to intensive stress applied to the external electrode 202a. In the second embodiment, the lead wire extending from the external electrode 202a is made of plated copper in the through-hole. Therefore, the crack is stopped by the plated copper in the through-hole, preventing the external electrode 202a from coming off the board 203 due to the crack.

(Third Embodiment)

Figure 7:
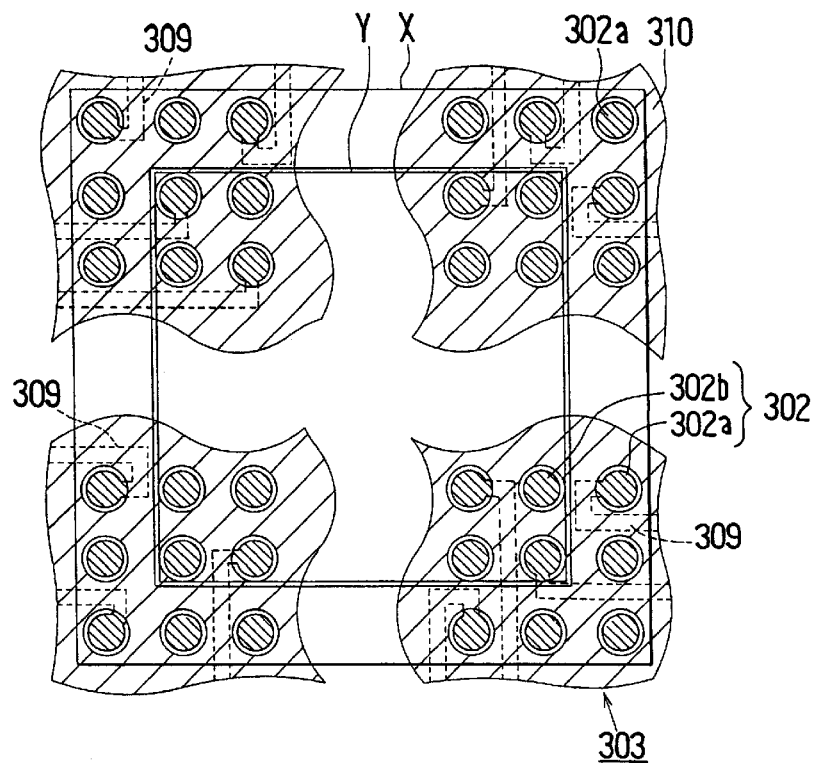
FIG. 7 is a schematic diagram showing electrodes of a multi-layer printed wiring board according to a third embodiment.

A third embodiment of the present invention will be described with reference to FIG. 7.

In the second embodiment, wiring layers 208 embedded in a multi-layer printed wiring board 203 is used as a lead wire for the external electrode 202a. However, the embedded lead wire for the external electrode 202a may interfere with a lead wire extending from an inner electrode 202b located inside the external electrodes 202a if the embedded lead wire needs to be used for the inner electrode 202b. In the third embodiment, as shown in FIG. 7, some of the most-externally-located electrodes 302a (hereinafter referred to as external electrodes 302a) are provided with lead wires 309 extending on the surface layer of a multi-layer printed wiring board 303 in the same manner as in the first embodiment, and the rest of the external electrodes 302a are provided with the lead wires 309 made of the copper foil or the plated copper embedded in the board 303 in the same manner as in the second embodiment. Therefore, it is possible to prevent the embedded lead wire from the inner electrode 302b from interfering with the lead wire from the external electrode 302a.

(Fourth Embodiment)

Figure 8:
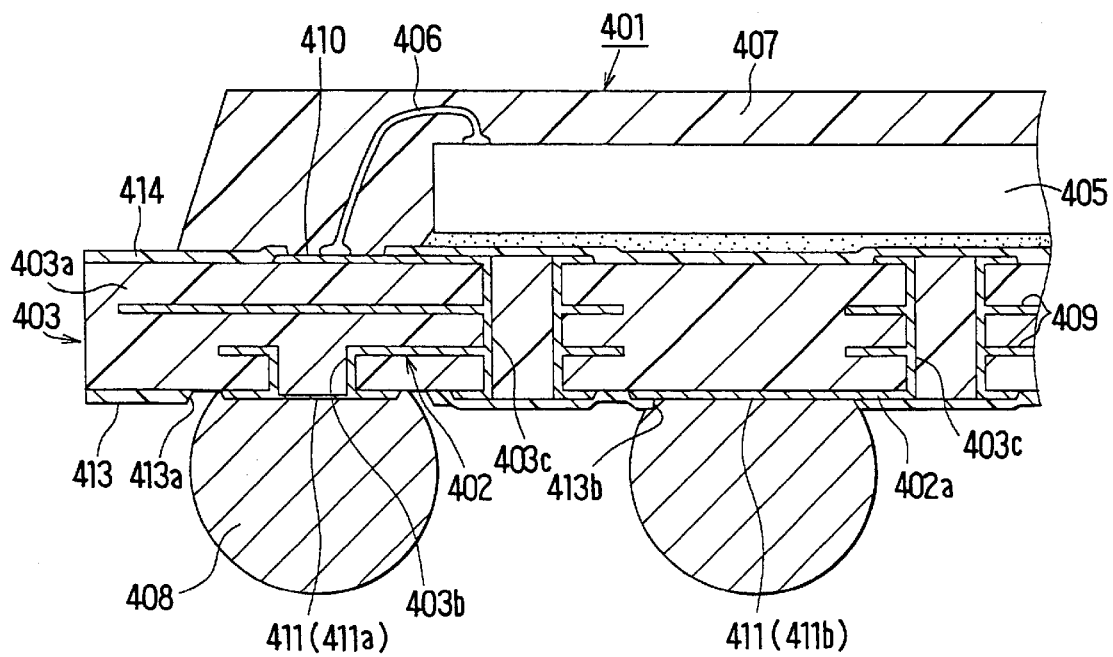
FIG. 8 is a schematic cross-sectional view showing a BGA package according to a fourth embodiment of the present invention.

A fourth embodiment of the present invention will be described with reference to FIGS. 8, 9.

In the fourth embodiment, an interposer 403 constituting the back of a BGA package 401 is a multi-layer wiring board having a wiring circuit 402 composed of a plurality of laminated wiring layers 409. On one surface of the interposer 403 on which a semiconductor chip 405 is mounted, a plurality of electrodes 410 are provided to be connected to a plurality of electrodes of the semiconductor chip 405. On the other surface of the interposer 403, a plurality of electrodes 411 are provided to be connected to a plurality of solder bumps 408. The electrodes 410 and 411 are electrically connected with each other through the wiring circuit 402.

The both surfaces of the interposer 403 provided with the electrodes 410, 411 are covered by solder resists 413, 414, respectively, for protecting the wires on the surface. The solder resists 413, 414 have a plurality of holes through which the electrodes 410, 411 are exposed, respectively. The solder resist 413 also functions to keep the solder bumps 408 to have the same height and to be in correct positions.

Figure 9:
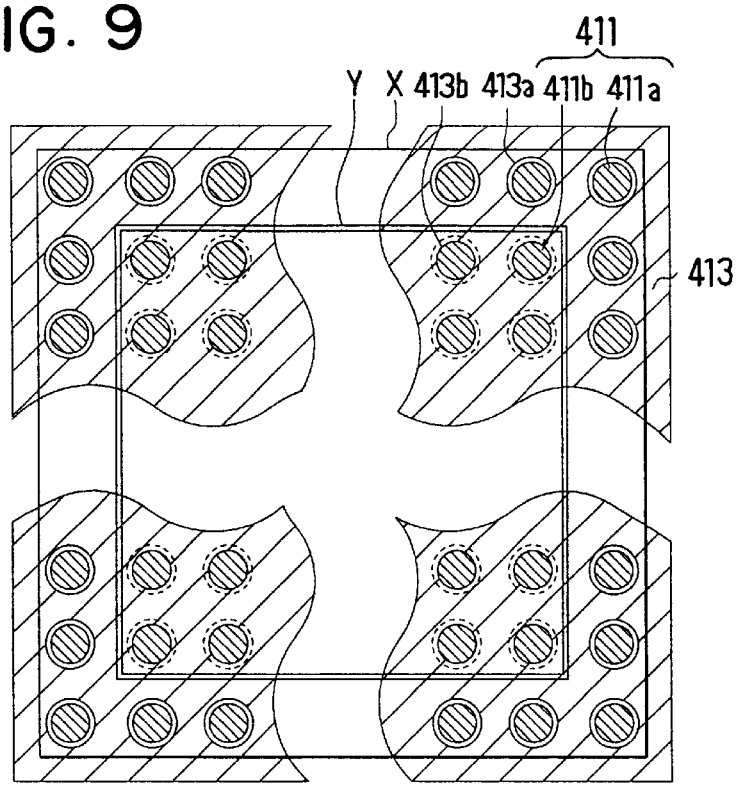
FIG. 9 is a schematic diagram showing electrodes of the BGA package according to the fourth embodiment.
Figure 10:
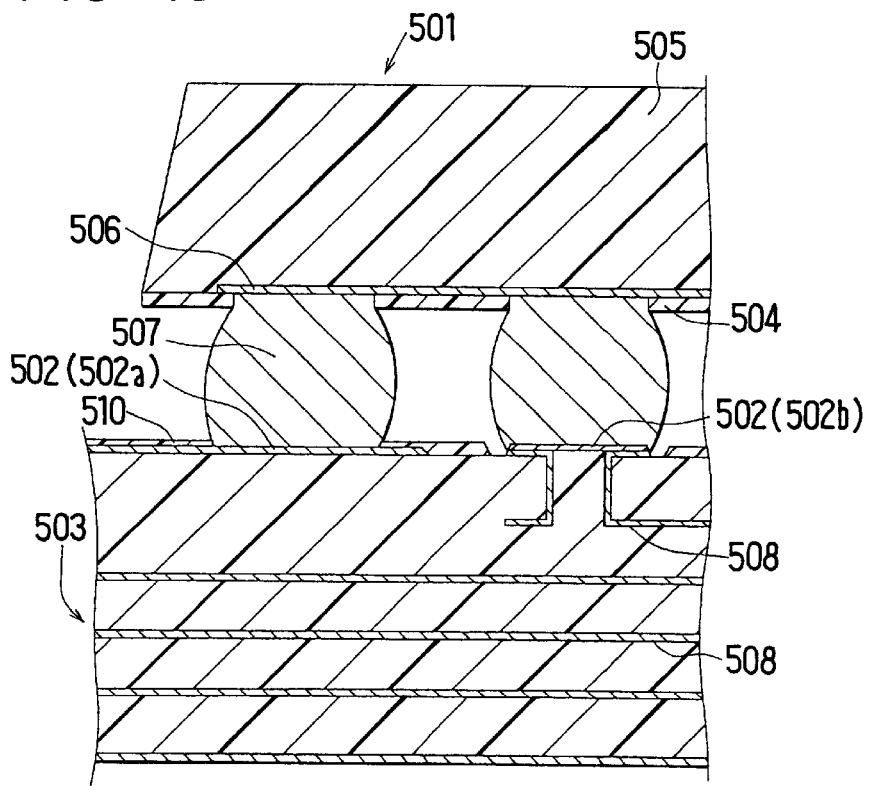
FIG. 10 is a schematic cross-sectional view showing a BGA package mounted on a multi-layer printed wiring board according to a fifth embodiment of the present invention.

As shown in FIG. 9, an array of substantial circular electrodes 411 is formed on a surface of the interposer 403, that is, the back surface of the BGA package 401. The most-externally-located electrodes 411a (hereinafter referred to as external electrodes 411a) within an area X are independent pads having lead wires embedded in a core material 403a of the interposer 403. Inner electrodes 411b surrounded by the external electrodes 411a, within an area Y, are provided with lead wires 402a exposed on the core material 403a. The holes 413a, 413b formed in the solder resist 413 are arranged corresponding to the configuration of the electrodes 411. Further, the hole 413a is formed so that the external electrode 411a is fully exposed, and the hole 413b is formed so that the peripheral portion of the inner electrode 411b is covered by the solder resist 413.

Generally, solder bumps are kept to have the same height and to be located in the correct positions by holes having a preset diameter formed in a solder resist, when the solder bumps are bonded to electrodes through the holes. That is, since the solder bumps are likely to be bonded to metals such as electrodes or wiring layers, the solder bumps may deviate from the correct positions or vary in height if the solder bumps are bonded to lead wires extending from the electrodes. Therefore, the lead wires are covered by the solder resist so that the solder bumps are solely bonded to the electrodes, thereby keeping the solder bumps to have the same height and to be in the correct positions. However, the lead wires may often not be covered by the solder resist due to printing error of the solder resist. Therefore, the outer peripheral portions of the electrodes are also covered by the solder resist so that the lead wires are reliably covered by the solder resist.

For the reason described above, the outer peripheral portion of the inner electrode 411b is also covered by the solder resist 413 so that the surface lead wire 402a is reliably covered by the solder resist 413. On the other hand, the external electrode 411a does not need to be covered by the solder resist 413 because the lead wire from the external electrodes 411 is not exposed on the surface of the interposer 403. Therefore, the hole 413a is made to have a larger diameter than that of the external electrode 411a so that the external electrode 411a is fully exposed.

Further, the diameter of the external electrode 411a and the diameter of the hole 413b for the inner electrode 411b are set to the same so that the solder bumps 408 have the same height and are located in the correct positions.

When solder balls are melted and bonded to each of the electrodes 411 formed on the back of the BGA package 401, the BGA package 401 having the solder bumps 408 is completed.

The interposer 403 is produced in substantially the same method as producing a multi-layer printed wiring board in the first embodiment. However, as shown in FIG. 8, the lead wire extending from a through-hole 403c to the external electrode 411a is not formed of the copper foil on the surface of the core material 403a, while the lead wire extending from the through-hole 403c to the inner electrode 411b is made of the surface copper foil. Next, resin is printed on the interposer 403 to fill the through-holes 403c, and the solder resist 413 is printed to protect the lead wires 402a. The diameter of the hole 413a of the solder resist 413 is determined so that the external electrode 411a is fully exposed even if a printing error occurs. The electrodes 411 may be plated with Ni—Au, Sn or Pd in a non-electrolytic plating step, if necessary. Preferably, the electrodes 411 are not plated so that a junction interface between the solder bump 408 and the electrode 411 becomes a ductile metal, thereby increasing bonding strength between the electrode 411 and the solder bump 408. The completed interposer 403 is attached to the semiconductor chip 405 in the same method as described in the first embodiment. The BGA package 401 is positioned and mounted on a substrate board through the solder bumps 408, and is electrically connected with outside circuits through the substrate board.

In the fourth embodiment, the external electrodes 411a are provided with the lead wires embedded in the core material 403a of the interposer 403, and are not covered by the solder resist 413 to be fully exposed. Therefore, the solder bumps 408 to be bonded to the external electrodes 411a terminate at peripheral ends of the external electrodes 411a, thereby increasing bonding strength between the solder bumps 408 and the external electrodes 411a. That is, the solder bumps 408 are bonded to not only the surfaces but also the sides of the external electrodes 411a, as shown in FIG. 8. This reinforces bonding between the solder bumps 408 and the external electrodes 411a. Accordingly, when the BGA package 401 is mounted on the substrate board through the solder bumps 408, the solder bumps 408 are prevented from cracking and/or coming off the external electrodes 411a, reducing contact failure between the BGA package 401 and the board.

Further, the core material 403a of the interposer 403 may have a crack due to intensive stress applied to the external electrodes 411a. In the fourth embodiment, the lead wires for the external electrodes 411a are made of the plated copper in the through-holes. Therefore, the crack is stopped by the plated copper, thereby preventing the external electrodes 411a from coming off the interposer 403 due to the crack.

In the fourth embodiment, the external electrodes 411a are independent pads having the lead wires formed within the interposer 403. However, the external electrodes 411a may be dummy electrodes which are not electrically connected with a semiconductor chip 405 disposed in the BGA package 401. In this case, the contact failure between the BGA package 401 and the substrate board can be reduced because stress caused by an external shock is intensively applied to the dummy electrodes. However, note that the BGA package 401 and the board need to be enlarged because the extra space is necessary for the dummy electrodes.

When the external electrode 411a has an exposed lead wire, the solder bump 408 may be bonded to the lead wire, leading to deviation from the correct position or deformation of the solder bump 408. As a result, during a recognition process of the BGA package 401 by a mounter before the BGA package 401 is mounted on the substrate board, irradiation light reflects irregularly due to the deviation or deformation of the solder bumps 408, resulting in that the BGA package 401 can not be recognized. Therefore, the external electrodes 411a are preferably independent pads having no exposed lead wire.

(Fifth Embodiment)

A fifth embodiment of the present invention will be described with reference to FIGS. 10, 11A, 11B and 12.

In the fifth embodiment, a multi-layer printed wiring board 503 has a plurality of electrodes 502 arranged in a matrix form, same as in the first embodiment. At least the most externally-located electrodes 502a (hereinafter referred to as external electrodes 502a) have an outer peripheral portion covered by a solder resist 510. Inner electrodes 502b located to be surrounded by the external electrodes 502b are not covered with the solder resist 510. However, the inner electrode 502b may also have an outer peripheral portion covered with the solder resist 510, same as the external electrodes 502a.

Figure 11A:
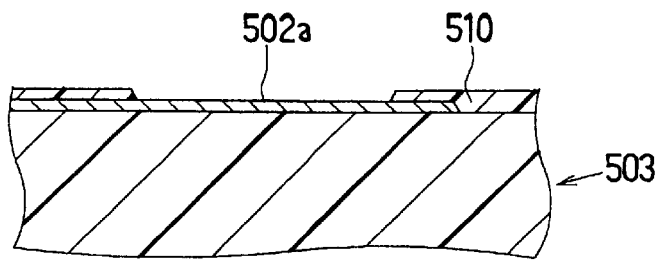
FIG. 11A is a schematic cross-sectional view showing a part of the multi-layer printed wiring board according to the fifth embodiment.
Figure 11B:
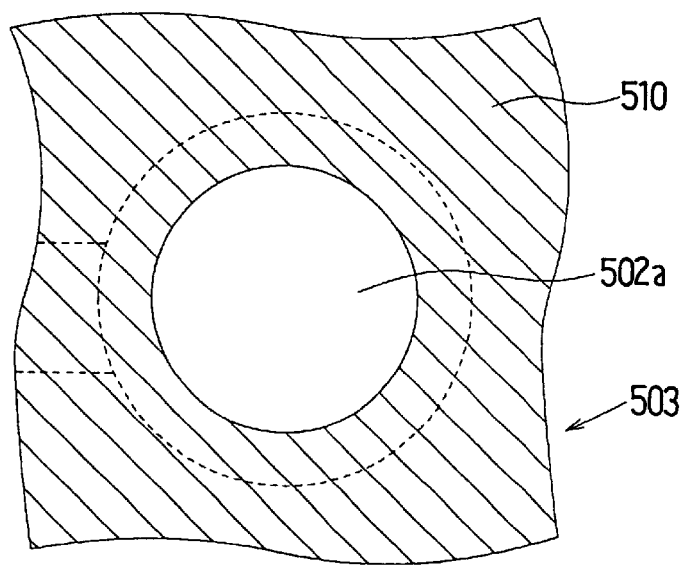
FIG. 11B is a schematic top view of an electrode of the multi-layer printed wiring board according to the fifth embodiment.

The multi-layer printed wiring board 503 is produced in the same method as described in the first embodiment. As shown in FIGS. 11a, 11b, in the fifth embodiment, the solder resist 510 is printed on the board 503 to cover lead wires and the outer peripheral portions of the external electrodes 502a for protection. The solder resist 510 is formed to overlap and cover the whole outer peripheral portions of the external electrodes 502a. The solder resist 510 has a plurality of circular holes through which the inner portions of the external electrodes 502a are exposed and are connected with solder bumps 507.

Figure 12:
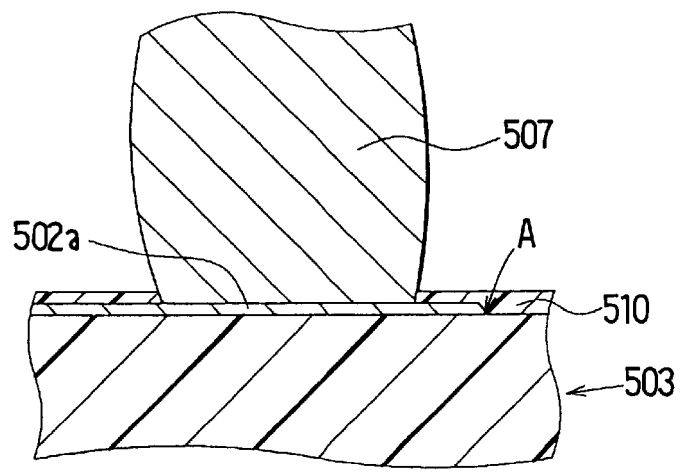
FIG. 12 is a schematic cross-sectional view showing a connection structure between a solder bump and the multi-layer printed wiring board according to the fifth embodiment.

Referring to FIG. 12, in the fifth embodiment, since the outer peripheral portions of the external electrodes 502a are covered by the solder resist 510, the solder bumps 507 do not reach an end portion A of a junction interface between the external electrodes 502a and a core material of the board 503, and the solder bumps 507 are bonded to only the inner portions of the external electrodes 502a. Therefore, the bonding portion between the solder bump 507 and the external electrode 502a, to which stress is intensively applied due to an external shock, does not conform to the end portion A, in which a crack of the core material is most likely to occur. This prevents the core material of the board 503 from cracking even when intensive stress is applied to the core material. Therefore, the lead wire is prevented from being cut due to cracking of the core material, thereby reducing contact failure between the BGA package 501 and the multi-layer printed wiring board 503.

In the fifth embodiment, the lead wire from the external electrode 502a is formed on the surface of the core material; however, the lead wire from the external electrode 502a may be formed in any inner layers of the multi-layer printed wiring board 503. Further, the external electrodes 502a may be dummy electrodes having no lead wire.

(Sixth Embodiment)

Figure 13:
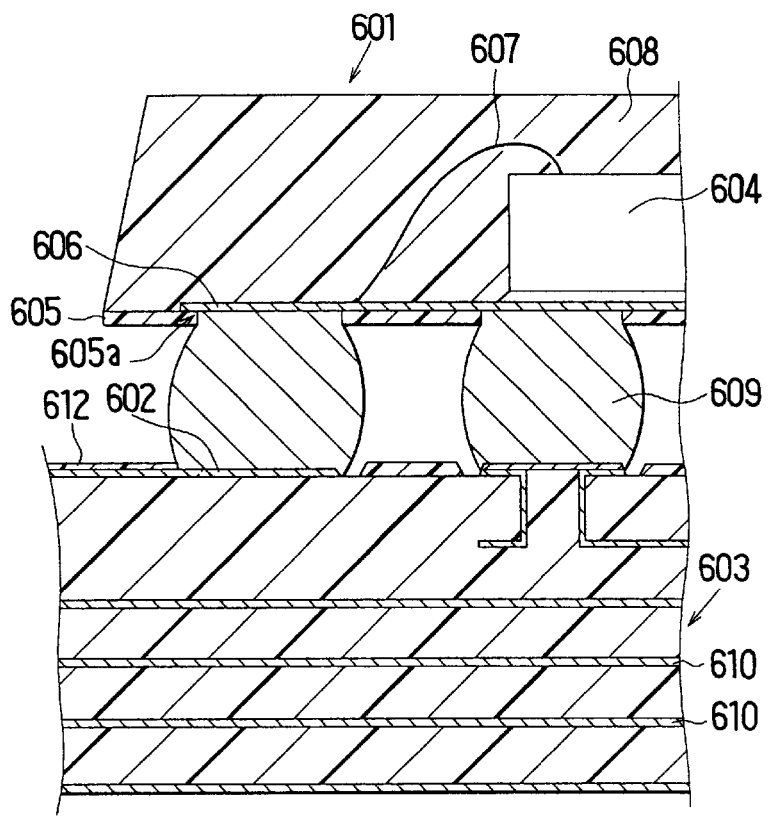
FIG. 13 is a schematic cross-sectional view showing a BGA package mounted on a multi-layer printed wiring board according to a sixth embodiment of the present invention.

A sixth embodiment of the present invention will be described with reference to FIGS. 13, 14 and 15.

A manufacturing method of a BGA package 601 will be described with reference to FIG. 13. An interposer 605 on which a semiconductor chip 604 is mounted is made of polyimide which can be readily thinned. A thin copper film is attached to one surface (hereinafter referred to as front surface) of the interposer 605 by adhesive and is formed into a circuit wiring layer 606 by pattern etching. On the other surface having no circuit wiring layer 606 (hereinafter referred to as back surface) of the interposer 605, an array of holes 605a penetrating the interposer 605 are formed by laser processing. The circuit wiring layer 606 on the front surface of the interposer 605 can be electrically connected with solder bumps 609 on the back surface side of the interposer 605 through the holes 605a.

Next, the circuit wiring layer 606 is plated with NI—Au by non-electrolytic method, while the entire back surface of the interposer 605 is masked by film tape to cover the holes 605a. The circuit wiring layer 606 is generally plated by non-electrolytic method. Then, the holes 605a in the interposer 605 are exposed by peeling off the film tape from the interposer 605. Thus, a back surface (i.e., a surface facing downwardly in FIG. 13) of the circuit wiring layer 606 is not plated with Ni—Au because the holes 605a are covered by the film tape during the non-electrolytic plating. The back surface of the circuit wiring layer 606 may be plated with Sn or Pd, if necessary. Further, the circuit wiring layer 606 may be plated with Sn or Pd instead of Ni—Au.

Next, the semiconductor chip 604 is adhered onto the interposer 605, and electrically connected to the circuit wiring layer 604 through Au-wires 607 or the like. Then, the semiconductor chip 608 and the Au-wires 607 are sealed by sealing resin 608 such as epoxy resin. Solder balls are placed each of the holes 605a of the interposer 605, and are melted to be bonded to the interposer 605. Thus, the BGA package 601 having an array of solder bumps 609 on the back is completed.

Figure 14:
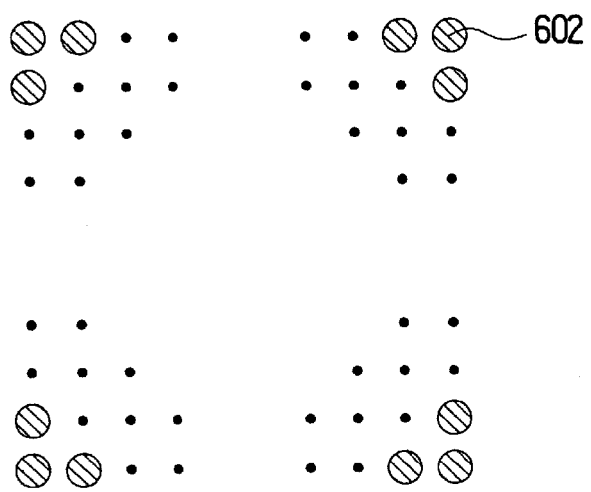
FIG. 14 is a schematic diagram showing a configuration pattern of electrodes of the multi-layer printed wiring board according to the sixth embodiment.

A multi-layer printed wiring board 603 is formed by laminating a plurality of wiring layers 610, and has an array of electrodes 602 on its top surface, as shown in FIG. 14. The configuration of the electrodes 602 conforms to the configuration of the solder bumps 609 so that each of the solder bumps 609 is connected to the conforming electrode 602 when the BGA package 601 is mounted on the multi-layer printed wiring board 603.

The multi-layer printed wiring board 603 is produced in the same method as described in the first embodiment. In the sixth embodiment, portions of the electrodes 602 to be bonded to the solder bumps 609 are not plated with Ni—Au, even when the multi-layer printed wiring board 603 is Ni—Au-plated.

Figure 15:
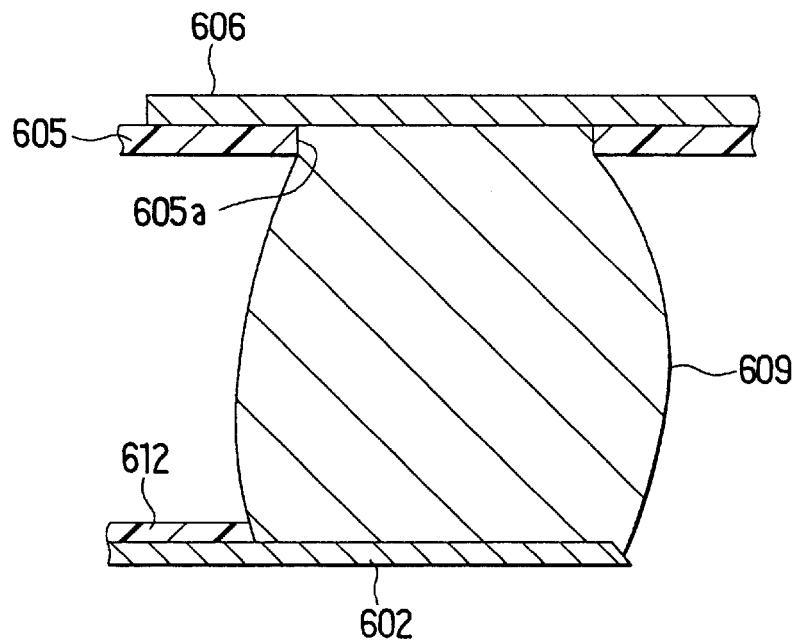
FIG. 15 is a schematic cross-sectional view showing connection structure between a solder bump and the BGA package and the multi-layer printed wiring board according to the sixth embodiment.
Figure 16:
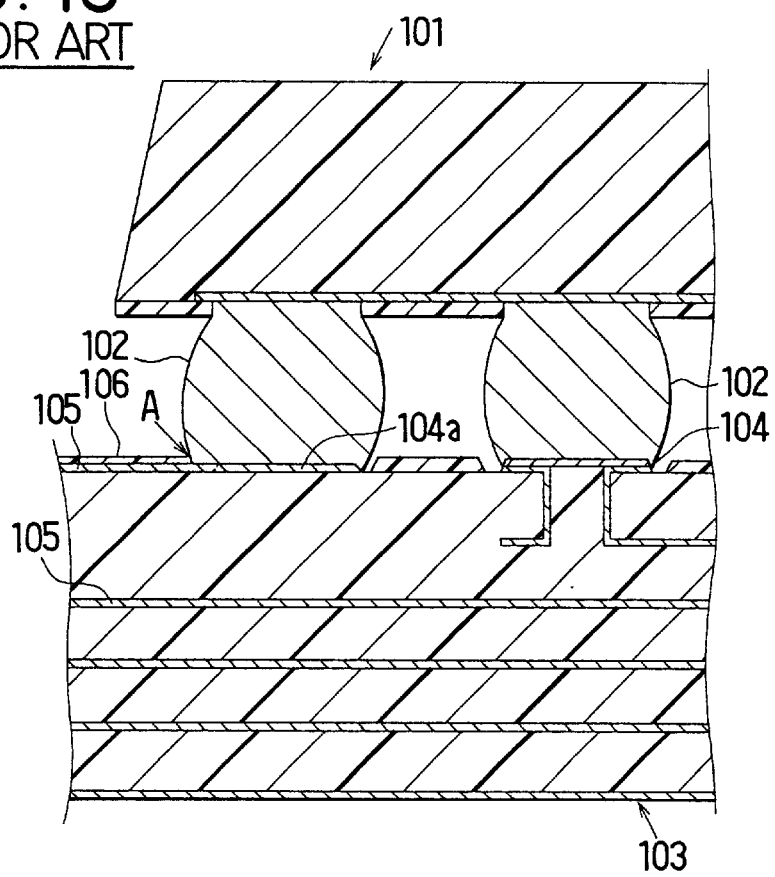
FIG. 16 is a schematic cross-sectional view showing a conventional BGA package mounted on a conventional multi-layer printed wiring board.
Figure 17:
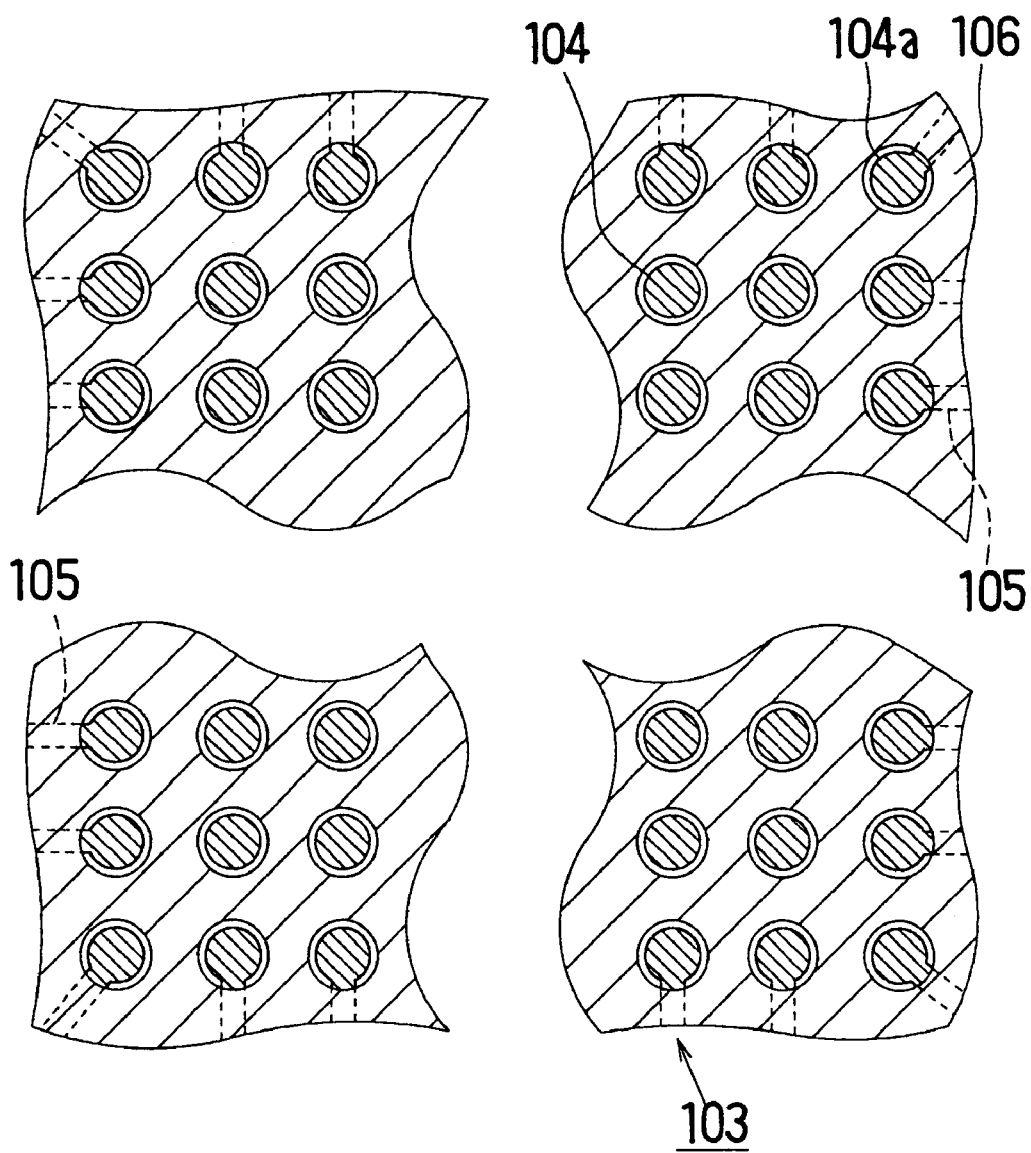
FIG. 17 is a schematic diagram showing electrodes of the conventional multi-layer printed wiring board.

According to the sixth embodiment, as shown in FIG. 15, the BGA package 601 is mounted on the multi-layer printed wiring board 603 through the solder bumps 609. The circuit wiring layer 606 and the electrodes 602 where the solder bumps 609 are bonded are metal such as Cu, Sn or Pd and are not plated with Ni—Au. Therefore, when the solder bumps 609 are bonded to the circuit wiring layer 606 and the electrodes 602, hard and brittle alloy is not formed at a junction interface between the solder bumps 609 and the circuit wiring layer 606, and at a junction interface between the solder bumps 609 and the electrodes 602. That is, alloy of Cu and Sn is formed between the solder bumps 609 and the circuit wiring layer 606, and between the solder bumps 609 and the electrodes 602 when the circuit wiring layer 606 and the electrodes 602 have the surface made of Cu, to be bonded to the solder bumps 609. The alloy of Cu and Sn is soft and ductile, and readily expands and contracts. Therefore, even when the multi-layer printed wiring board 603 warps, the alloy does not break, preventing the solder bumps 609 from coming off.

Thus, in the sixth embodiment, the circuit wiring layer 606 has the surface made of Cu, Sn or Pd to be bonded to the solder bumps 609, and the electrodes 602 have the surfaces made of Cu, Sn or Pd to be bonded to the solder bumps 609. This prevents the solder bumps 609 from coming off the circuit wiring layer 606 and the electrodes 602, reducing contact failure between the BGA package 601 and the multi-layer printed wiring board 603, even when stress is applied to the BGA package 601 or the board 603 due to warping of the board 603 or the like.

Further, when the surfaces of the electrodes 602 to be bonded to the solder bumps 609 are made of Cu or the like, each of the electrodes 602 preferably has an outer peripheral portion covered by solder resist 612, as in the fifth embodiment.

Portable electronic equipments such as a cellular phone generally are likely to suffer an external shock due to dropping or the like, resulting in a contact failure between an electronic component and a substrate board. Therefore, if the first through six embodiments are applied to the cellular phone, the contact failure is effectively prevented from occurring.

Although the present invention has been fully described in connection with preferred embodiments thereof with reference to the accompanying drawings, it is to be noted that various changes and modifications will become apparent to those skilled in the art.

Such changes and modifications are to be understood as being within the scope of the present invention as defined by the appended claims.

What is claimed is:

1. A mounting structure of an electronic component on a substrate board, comprising:
   a plurality of solder bumps disposed on one surface of said electronic component;
   a plurality of substantially circular first electrodes formed on said substrate board corresponding to said solder bumps, wherein said solder bumps are melted and bonded to said electrodes to electrically connect said electronic component with said substrate board through said solder bumps and said electrodes; and
   lead wires formed in the substrate board and connected to each of said electrodes, wherein:
   said lead wires connected to most-externally-located electrodes are formed on said substrate board and extend from portions of said most-externally-located electrodes located inside of a polygon formed by connecting each of centers of adjacent most-externally-located electrodes and solder bumps corresponding to said most-externally-located electrodes are bonded to not only surfaces thereof but also sides thereof at the portions of said most-externally-located electrodes located outside of said polygon.

2. A mounting structure according to claim 1, wherein:
   said lead wires connected to said most-externally-located electrodes extend toward an outside of the polygon while bending in an uniform direction, with respect to each of said most-externally-located electrodes.

3. A mounting structure according to claim 1, wherein:
   said solder bumps bonded to said most-externally-located electrodes terminate on outer peripheral portions of said most-externally-located electrodes at least locations where stress due to an external force is intensively applied.

4. A mounting structure according to claim 1, wherein:
   said substrate board includes a plurality of through-holes and a plurality of wiring layers formed thereinside;
   said wiring layers are electrically connected with each other through said through-holes;
   at least one of said through-holes is disposed under one of said most-externally-located electrodes; and
   said lead wire connected to said one of said most-externally-located first electrodes is made of said through-hole and said wiring layers.

5. A mounting structure according to claim 1, further comprising:
   an interposer disposed on said electronic component;
   a plurality of interposer electrodes formed on said interposer corresponding to said solder bumps, wherein said solder bumps are melted and bonded to said interposer electrodes, wherein:
   said solder bumps bonded to most-externally-located interposer electrodes terminate on outer peripheral portions of said most-externally-located interposer electrodes at least locations where stress due to an external force is intensively applied.

6. A mounting structure according to claim 5, wherein:
   said interposer includes a wiring circuit which electrically connects said electronic component with said interposer electrodes.

7. A mounting structure according to claim 6, wherein:
   said wiring circuit includes a plurality of through-holes and a plurality of wiring layers formed thereinside;
   said wiring layers are electrically connected with each other through said through-holes;
   at least one of said through-holes is disposed under one of said most-externally-located interposer electrodes; and
   said lead wire from said one of most-externally-located interposer electrodes is made of said through-holes and said wiring layers.

8. A mounting structure according to claim 1, wherein:
   said electronic component is used for a portable machine.

9. A mounting structure according to claim 8, wherein:
   said portable machine is a cellular phone.

\* \* \* \* \*